United States Patent
Shih et al.

[19]

[11] Patent Number: 6,132,161
[45] Date of Patent: Oct. 17, 2000

[54] CHIP SUPPLYING APPARATUS PERFORMING STABLE BLUE-FILM-EXPANSION OPERATION

[75] Inventors: Tun-Chih Shih; Wen-Jung Lu; Wen-Chin Cheng; Ming-Liang Hsieh, all of Hsinchu, Taiwan

[73] Assignee: Industrial Technology Research Institute, Hsinchu, Taiwan

[21] Appl. No.: 08/954,810

[22] Filed: Oct. 21, 1997

[51] Int. Cl.[7] ................................................. B65G 69/00
[52] U.S. Cl. ........................... 414/417; 156/384; 29/413; 29/426.6; 225/103; 414/403; 192/82 R
[58] Field of Search ................................... 29/413, 426.6; 225/103; 156/584, 344, 749, 1, 222.01, 811, 403; 414/416, 417, 935; 192/82 R

[56] References Cited

U.S. PATENT DOCUMENTS

| | | | |
|---|---|---|---|
| 3,537,603 | 11/1970 | Willis et al. .............................. | 414/811 |
| 4,850,780 | 7/1989 | Safabakhsh et al. .................... | 414/417 |
| 4,936,944 | 6/1990 | Fuke et al. ............................... | 156/584 |

*Primary Examiner*—Frank E. Werner
*Attorney, Agent, or Firm*—Friedman Siegelbaum LLP

[57] ABSTRACT

A chip supplying apparatus for picking chips from a wafer positioned on an elastic film is disclosed. The chip supplying apparatus includes a shifting device, a clutch device, a film-expanding device, and a chip-picking device. In the present chip supplying apparatus, the input torque provided by the clutching device for driving the film-expanding device to perform a film-expanding operation is orthogonal to the resulting rotation torque of the film-expanding device. Therefore, when the film-expanding operation is performed, the film-expanding device will not shake. In other words, the present chip supplying apparatus can perform stable film-expanding operation.

12 Claims, 9 Drawing Sheets

6,132,161

CHIP SUPPLYING APPARATUS PERFORMING STABLE BLUE-FILM-EXPANSION OPERATION

FIELD OF THE INVENTION

The present invention is related to a chip supplying apparatus, and more particularly to a chip supplying apparatus capable of performing quick pick-and-place cycle.

BACKGROUND OF THE INVENTION

As known to those skilled in the art, when the chips of a wafer pasted on an elastic blue film which is supported by a wafer frame are to be selectively picked up one by one, those chips have to be moved to accessible positions for chip-picking device. In addition, the blue film should be stretched to increase the clearances between every two chips so that a selected chip can be easily picked up.

Major devices of a conventional chip supplying apparatus are mounted on a working table, as shown in FIG. 1.

FIG. 1 shows the circular working table and the wafer to be dealt with, and includes a rotating platform 101, an X-axial moving arm 102, a Y-axial moving arm 103, an air-compressing cylinder 104, a clutch arm 105, a transmitting gear 106, a plane-rotation control gear 107, a wafer frame 108, a blue film 109 for being placed thereon chips 110, a plurality of wafer-expanding gears 111, a transmitting belt 112, a film-expanding control gear 113, a plurality of film-expanding bolts 114, a film-expanding plywood 115 and a film-expanding ring 116. Firstly, the wafer frame 108 is placed on the working platform 101, and is precisely positioned for its X- and Y-axial positions by the X-axial moving arm 102 and the Y-axial moving arm 103. Then, the clutch arm 105 is driven by the air-compressing cylinder 104 to have the transmitting gear 106 engaged with the film-expanding control gear 113. When a motor is started, it drives the transmitting gear 106 to transmit the film-expanding control gear 113 and further transmit the film-expanding gears 111 to synchronously rotate under the connection by the transmitting belt 112. Meanwhile, the film-expanding bolts 114 rotate in response to the rotation of the film-expanding gears 111 to make the film-expanding plywood 115 and the film-expanding ring 116 have relative motion. For example, the film-expanding plywood 115 with the wafer frame 108 descends relative to the film-expanding ring 116 to a level substantially below the film-expanding ring 116 so that the blue film 109 within the wafer frame 108 can be stretched by the film-expanding ring 116. Accordingly, the clearances between every two chips op the stretched blue film 109 are increasing to facilitate the chip-picking operation of the chips. The plane-rotation control gear 107 in this apparatus is used for controlling the rotation of the rotating platform 101 and keeping the orientation of the working platform 101 during the stretch of the blue film 109.

The chip supplying apparatus described as above is generally used in the current semiconductor industrial and has shortcomings of:

1. rendering shakes of the rotating platform during the stretch of the blue film due to the dependence of the torque of the film-expanding and clutching mechanism on the rotational torque of the rotating platform, Such a situation may somewhat damage the chip supplying apparatus so as to require frequent maintenance. By the way, it is inconvenient for the rotating platform to be operated and maintained in case of over weight and volume and insufficient strength;
2. occupying lots of space due to the arrangement of the X- and Y-axial moving arms beside the rotating platform; and
3. hindering the loading/unloading of wafer frames into/out of the chip supplying apparatus because the X- and Y-axial moving arms are arranged beside the rotating platform.

SUMMARY OF THE INVENTION

An object of the present invention is to provide a chip supplying apparatus which can perform stable film-expanding operation due to the orthogonal relationship between the input torque from the clutch device and the resulting rotational torque of the film-expanding device.

Another object of the present invention is to provide a chip supplying apparatus which occupies a reduced space due to the arrangement of the X- and Y-axial moving mechanism and the plane-rotation control mechanism under the working platform rather than beside the working platform.

The present invention is related to a chip supplying apparatus for picking chips from a wafer positioned on an elastic film. The chip supplying apparatus includes a working platform for supporting the elastic film thereon; a film-expanding device located on the working platform, positioning the elastic film therein, and performing a film-expanding operation of the elastic film in response to an input torque in order to increase clearances between every two chips before a chip-picking operation is to be performed; a clutch device engaged with the film-expanding device for keeping the film-expanding device from moving and providing the input torque for the film-expanding device when the film-expanding operation of the elastic film is to be performed; a shifting device movably engaged with the working platform for moving the film-expanding device between a film-expanding position and a chip-picking position; and a chip-picking device for picking Up a selected chip from the elastic film which is moved to the chip-picking position; wherein the input torque provided by the clutching device is orthogonal to the resulting rotation torque of the film-expanding device.

Preferably, the chip supplying apparatus further includes a rotating device for rotating the elastic film. The rotating device may include a first motor; a rotating seat rotatably engaged with the working platform and positioned thereon the elastic film; a first gear securely mounted around the rotating seat; and a second gear engaged with the first gear and driven by the first motor to rotate the rotating seat and the elastic film. The rotating device preferably further includes a bearing mounted between the rotating seat and the working platform for facilitating the rotation of the rotating seat.

In an embodiment of the chip supplying apparatus according to the present invention, the shifting device includes an X-directional guiding member for sliding the working platform along an X-direction; and a Y-directional guiding member for sliding the working platform along a Y-direction perpendicular to the X-direction; wherein one of the X- and the Y-directional guiding members is located over the other one.

On the other hand, the film-expanding device may include a plywood having a plurality of threaded holes and used for clamping the elastic film in position; a plurality of belt pulleys mounted on the rotating seat, each of which has a through hole respectively aligned with one of the threaded holes; a belt connecting the plurality of belt pulleys for simultaneously transmitting the plurality of belt pulleys to rotate; a plurality of bolts, each of which is respectively engaged with one of the threaded holes and secured in one of the through holes, one of the plurality of bolts serving as an active bolt and being driven by the clutch device to rotate the belt pulleys for allowing the plywood to move upwards/downward; and a film-expanding ring located below the elastic film, and stretching the elastic film when the plywood moves downward.

In another embodiment of the present invention, the rotating seat has a plurality of through holes respectively aligned with the threaded holes of the plywood and the through holes of the belt pulleys so that each of the bolts passes through one threaded hole and two through holes and protrudes downward from the rotating seat. The clutch device includes a stand; a second motor mounted on a stand wall of the stand; a first coupling member mounted on the stand wall and driven by the second motor to rotate in a first direction; a second coupling member located below the rotating seat, and engaged with the first coupling member to be rotated in the first direction when the film-expanding operation is to be operated; and a third coupling member located below the rotating seat, engaged with the second coupling member and the active bolt, and rotating the active bolt in a second direction orthogonal to the first direction in response to the rotation of the second coupling member in the first direction for performing the film-expanding operation.

For example, the first coupling member can be a plug connector including two symmetric plugs, the second coupling member can be a receptacle connector including two depressions for respectively receiving therein the two plugs, and the third coupling member preferably include a worm and a worm gear.

Further, the clutch device preferably further includes a buffering member, e.g. a spring, behind the stand wall to allow the stand wall slightly move back when the plugs cannot enter the depressions adequately in order to protect the plugs.

As for the chip-picking device, it may include an ejection driver; an ejecting pin arranged under the chip-picking position of the film-expanding device and driven by the ejecting driver to eject upward the selected chip when the chip-picking operation is performed; and a suction member attached to the elastic film for positioning the selected chip when the chip-picking operation is performed so as to facilitate an ejection operation of the ejecting pin. Preferably, an adjusting device is provided for lowering the chip-picking device during the film-expanding device is moved between the film-expanding position and the chip-picking position in order to avoid interfering the movement of the film-expanding device.

BRIEF DESCRIPTION OF THE DRAWING

The present invention may best be understood through the following description with reference to the accompanying drawings, in which.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 1:
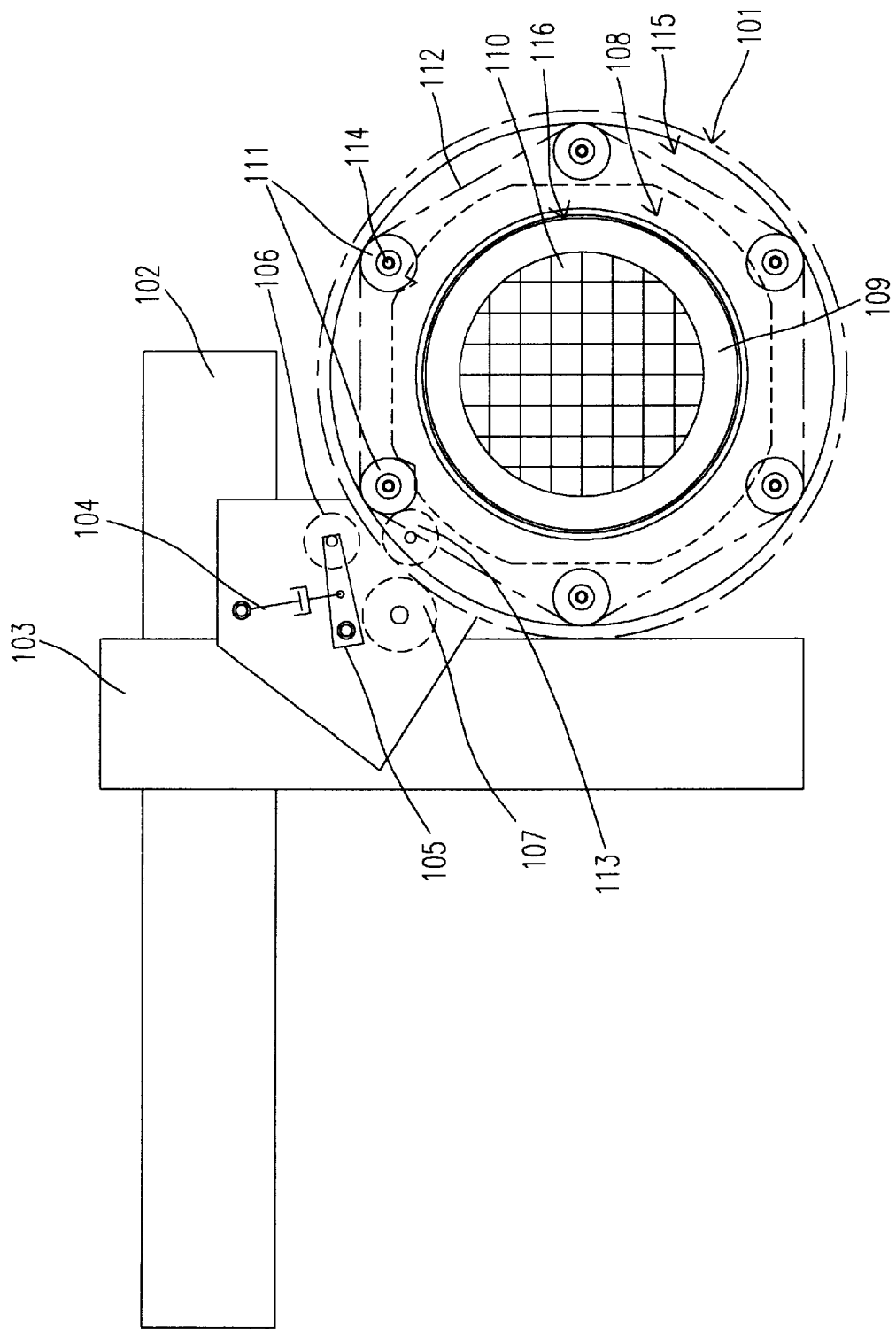
FIG. 1 is a schematically diagram showing a top view of a conventional chip supplying device.
Figure 2:
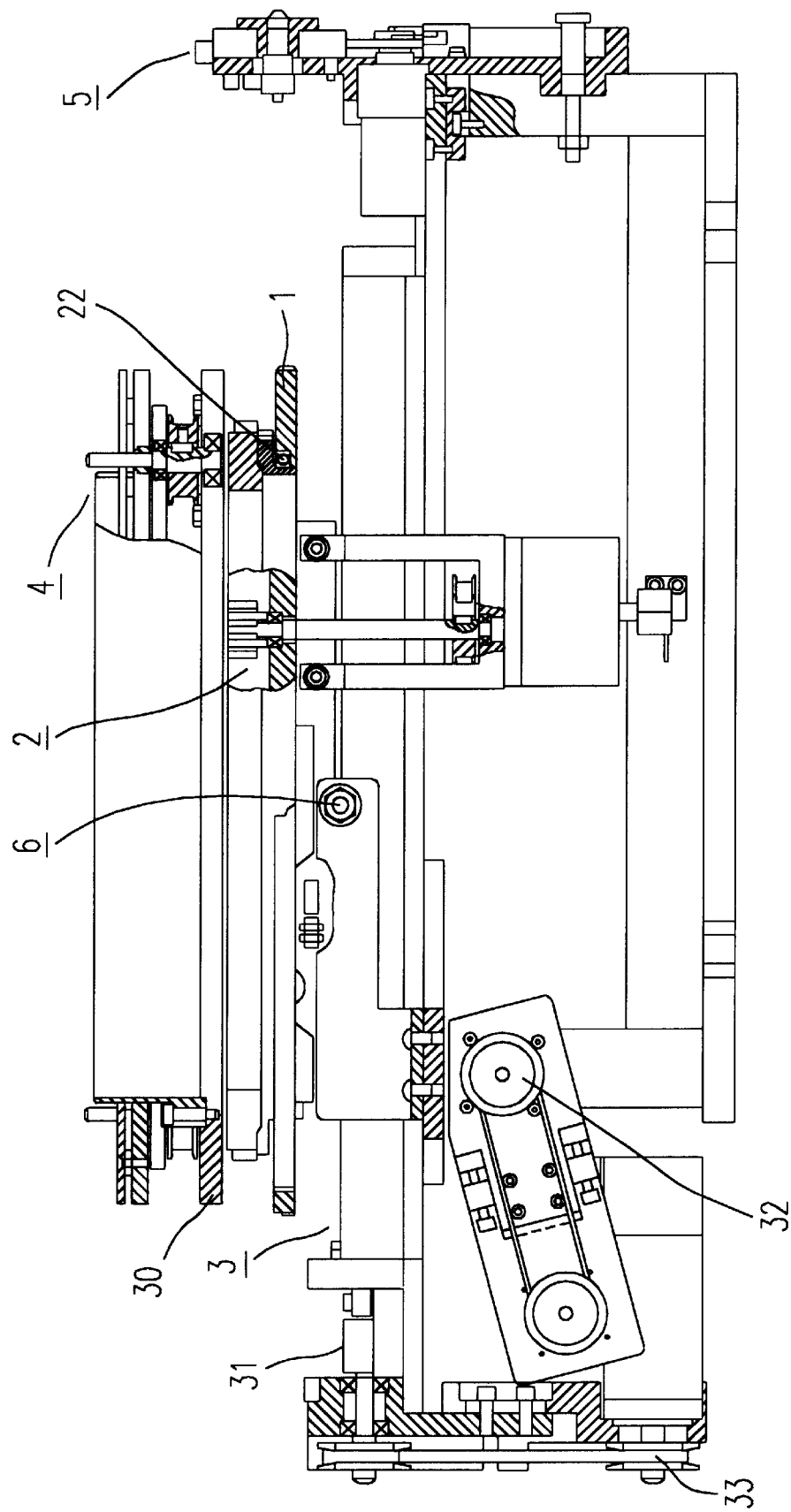
FIG. 2 is a side elevational view schematically showing a preferred embodiment of the present chip supplying apparatus.

Please refer to FIG. 2 which schematically shows the basic position relationship among the devices of a preferred embodiment of a chip supplying apparatus according to the present invention. The chip supplying apparatus includes a working platform 1, a rotating device 2, a shifting device 3, a film-expanding device 4, a clutch device 5, and a chip-picking device 6. The shifting device 3 includes an X- and a Y-sliding tracks 31 and 32. The X-sliding track 31 is located under the working platform 1, and the Y-sliding track 32 is located under the X-sliding track 31. The working platform I is a plate having a through hole 14 (FIG. 3), and a hollow rotating seat 21 included in the rotating device 2 is engaged into the through hole 14 of the working platform 1 via a bearing 22. The film-expanding device 4 containing the wafer frame (including the elastic blue film and chips) is mounted on the rotating seat 21. A part of the clutch device 5 is located beside the movable working platform group 1, 2 and 4, and another part of the clutch device is mounted in the working platform group. The details in structure and operation of elements will be illustrated hereinafter.

SHIFTING DEVICE

Figure 3:
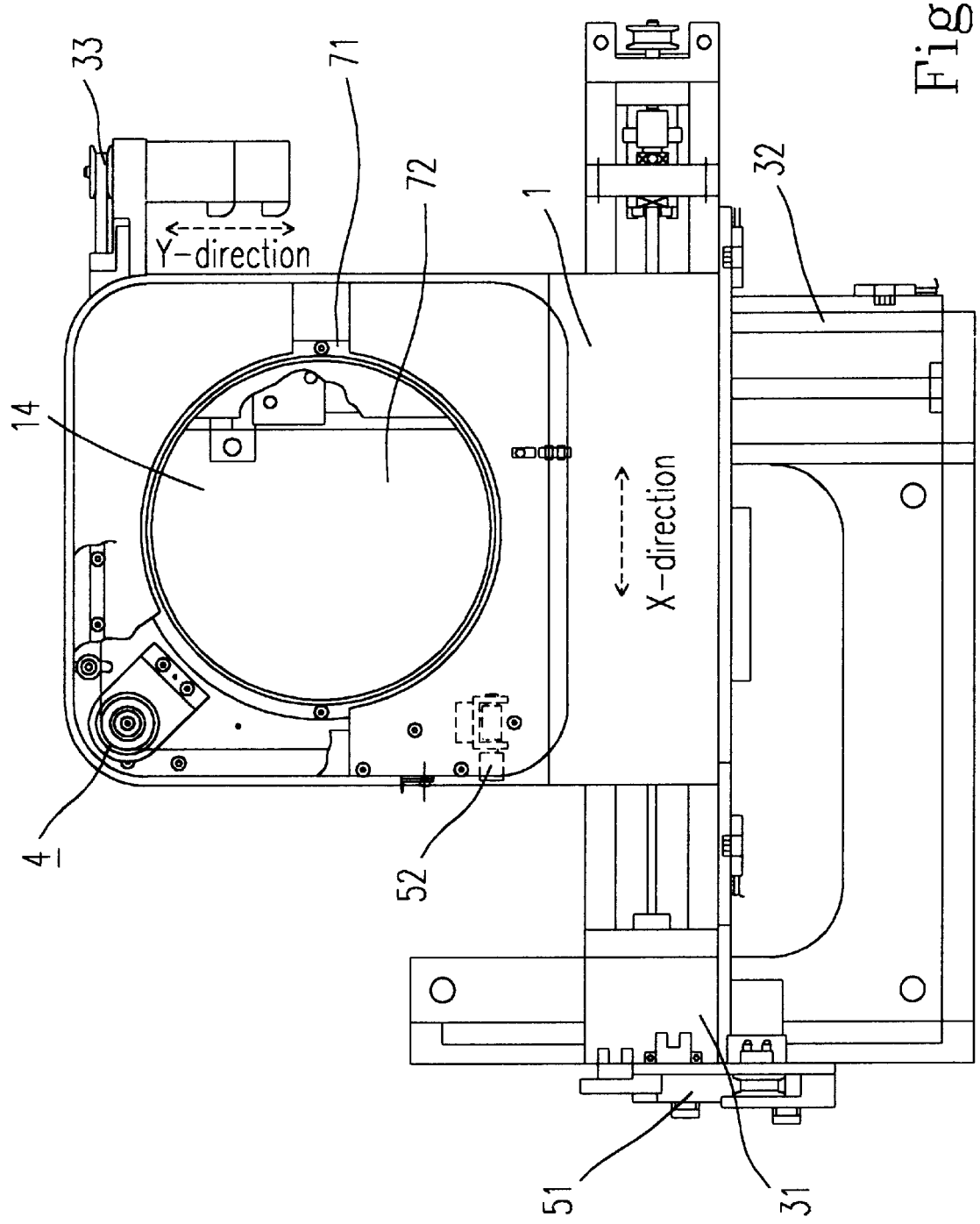
FIG. 3 is a top plane view schematically showing a preferred embodiment of a shifting device according to the present invention.

Please refer to FIG. 3 which is a top plane view schematically showing a preferred embodiment of a shifting device according to the present invention. As disclosed above, the shifting device includes a X- and a Y-sliding tracks 31 and 32. The X-sliding track 31 is located under the working platform 1, the Y-sliding track 32 is located under the X-sliding track 31, and the two sliding tracks 31 and 32 are driven by respective servo-type motors 33 to transmit the working platform group 1, 2 and 4 to move along X-direction and/or Y-direction. After a wafer frame 71 clamping therein an elastic blue film 72 having thereon a wafer (not shown) is loaded into the film-expanding device 4, the working platform group 1, 2 and 4 is moved by the shifting device 3 to engage with the clutch device 5 via the clutch parts 51 and 52, i.e. a film-expanding position, to perform a film-expanding operation. Afterwards, the working platform group is moved by the shifting device 3 to a chip-picking position, i.e. a position above the chip-picking device and beside a mechanical arm (not shown), to perform a chip-picking operation.

Owing to the overlapping arrangement of the working platform and sliding tracks, the required working area is reduced. In addition, the shifting device arranged below the working platform will not hinder the loading/unloading operation of a wafer frame into/out of the film-expanding device any longer.

ROTATING DEVICE

Figure 4:
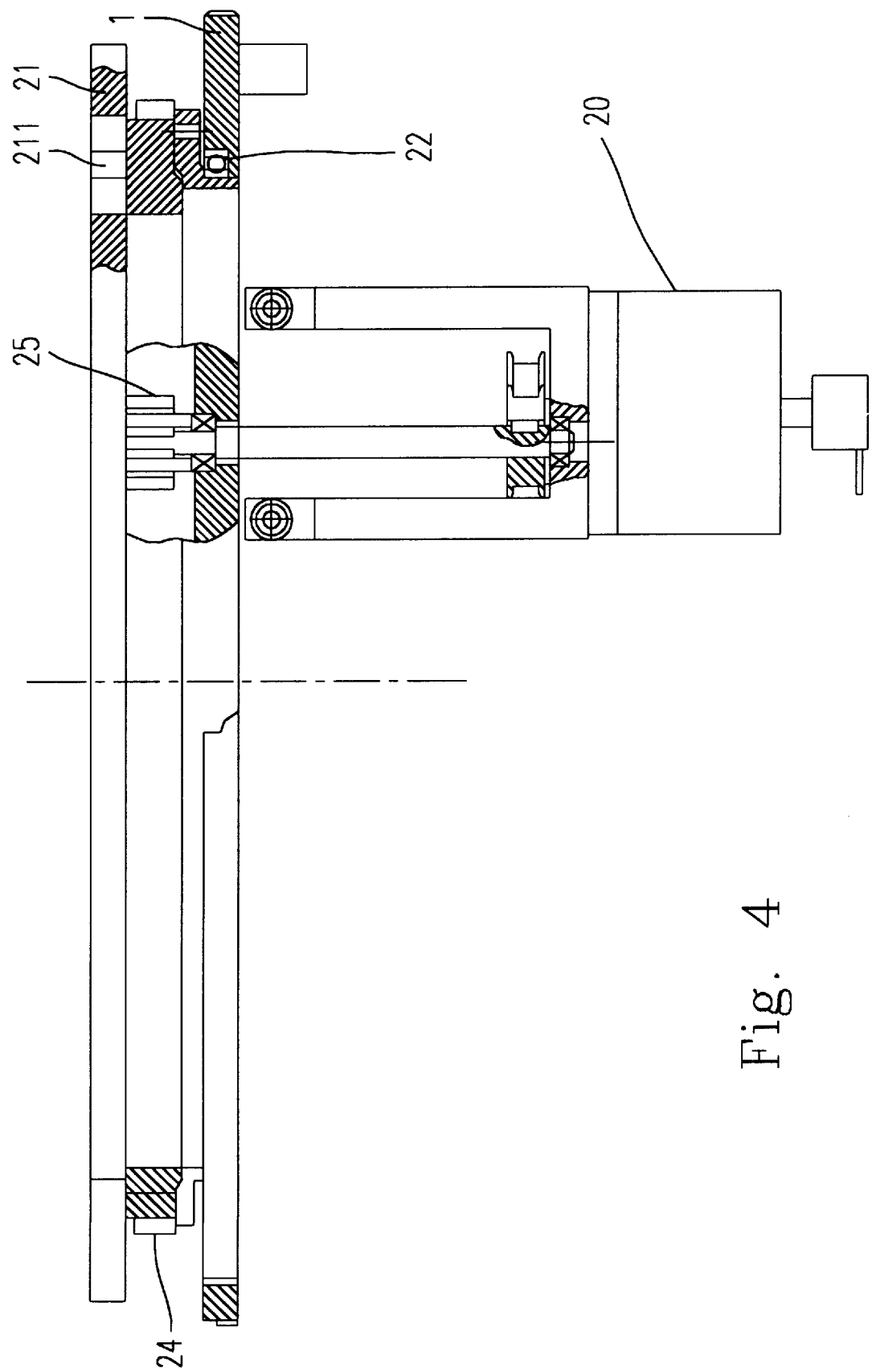
FIG. 4 is a side elevational view schematically showing a preferred embodiment of a rotating device according to the present invention.

Please refer to FIG. 4 which is a side elevational view schematically showing a preferred embodiment of a rotating device according to the present invention. The rotating device includes a step motor 20, a hollow rotating seat 21 as mentioned above, a bearing 22 arranged between the rotating seat 21 and the working platform 1, a gear 24 securely mounted around the rotating seat 21, and a gear 25 engaged with the gear 24 and connected to the motor 20. When the motor 20 is started, the gear 25 is driven by the motor 20 to engagingly rotate the gear 24, and further the rotating seat 21. Accordingly, the film-expanding device and the wafer positioned on the rotating seat 21 will be simultaneously rotated to a desired orientation in order to pick up a selected chip.

It is to be noted that the present chip supplying apparatus can work without any rotating device. However, the provision of the rotating device can make the chip-picking operation more efficient.

FILM-EXPANDING DEVICE

Figure 5A:
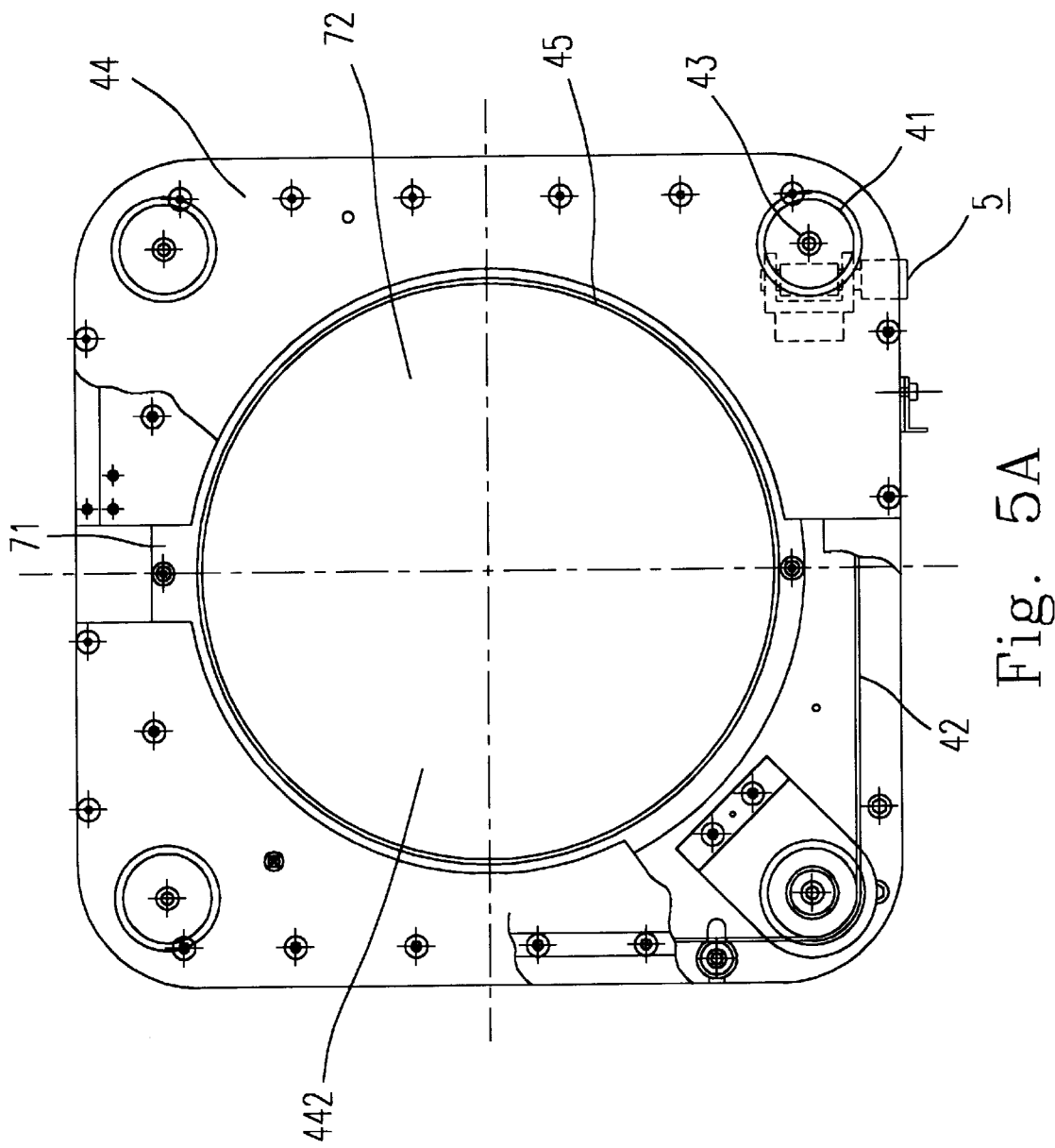
FIGS. 5A and 5B are a top plane and a side elevational views schematically showing a preferred embodiment of a film-expanding device according to the present invention, respectively.
Figure 5B:
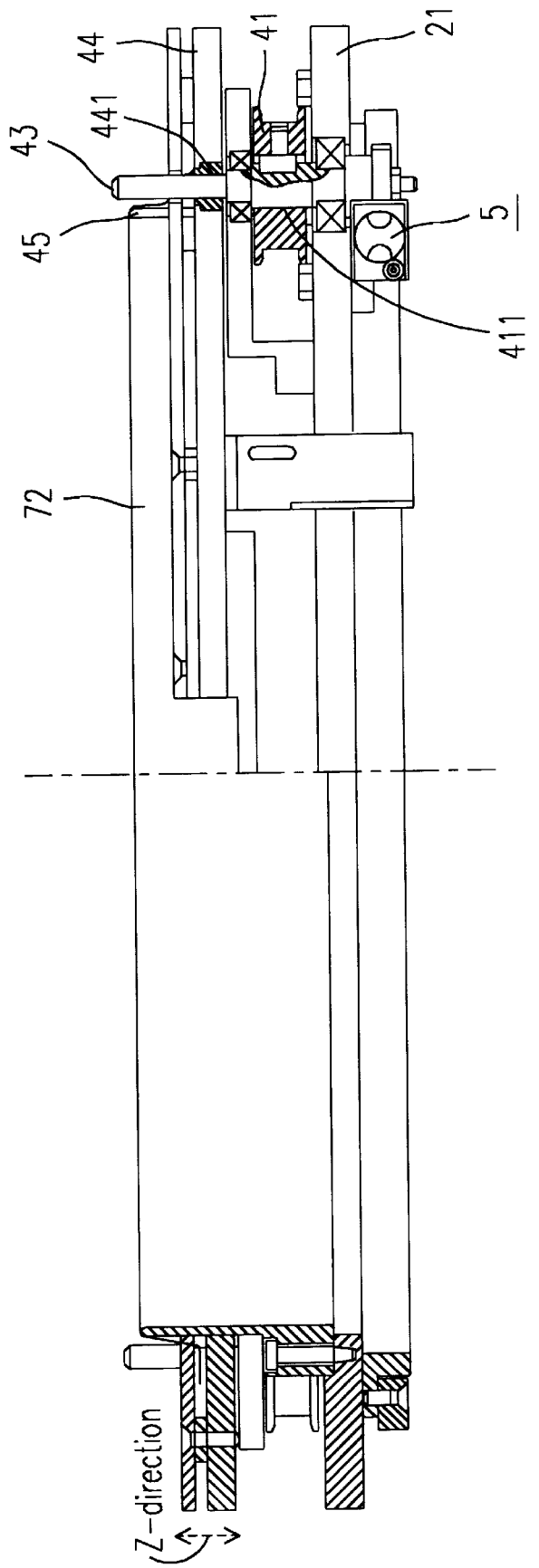

Please refer to FIGS. 5A and 5B which schematically shows the film-expanding mechanism of the film-expanding device 4 according to the present invention in a top plane and a side elevational views, respectively. The film-expanding device 4 includes a plywood 44 having a centrally located opening 442 and sandwiching therein the wafer frame 71, four belt pulleys 41 mounted on the rotating seat 21 and located under four corners of the plywood 44, a belt 42 connecting the four belt pulleys 41, and four bolts 43 penetrating the plywood 44, the belt pulleys 41 and the rotating seat 21 for combining the rotating device and the film expanding device as a whole. Each of the bolts 43 includes three sections, wherein the upper portion having screw thread thereon is engaged with one of four threaded holes 441 of the plywood 44 aligned with the four belt pulleys 41, respectively, the middle portion of the bolt 43 penetrates one of four through holes 411 of the belt pulleys 41 and is securely attached to the wall of the through hole 411 for example by a pin (not shown), and the lower portion protrudes downward from the rotating seat 21 through a through hole 211 (FIG. 4) to be engaged with the clutch device. The film-expanding device further includes a film-expanding ring 45 located within the opening 442 and under the blue film 72. When the plywood 44 descends and the film-expanding ring 45 keeps unmoved, the blue film 72 will be stretched so that the chips of the wafer separate. That is the film-expanding operation. After the film-expanding operation, a chip-picking operation is performed and it will be described in the CHIP-PICKING DEVICE part. After the chip-picking operation is finished and the wafer frame 71 is to be unloaded from the film-expanding device, the plywood 44 ascends to release the blue film 72 to its original state so that the wafer frame 71 can be unloaded out of the film-expanding device from a passage between the two plates of the plywood 44. As for the descent and the ascent of the plywood 44, they are controlled by the clutch device 5, the bolts 43, the belt pulleys 41 and the belt 42.

CLUTCH DEVICE

Figure 6A:
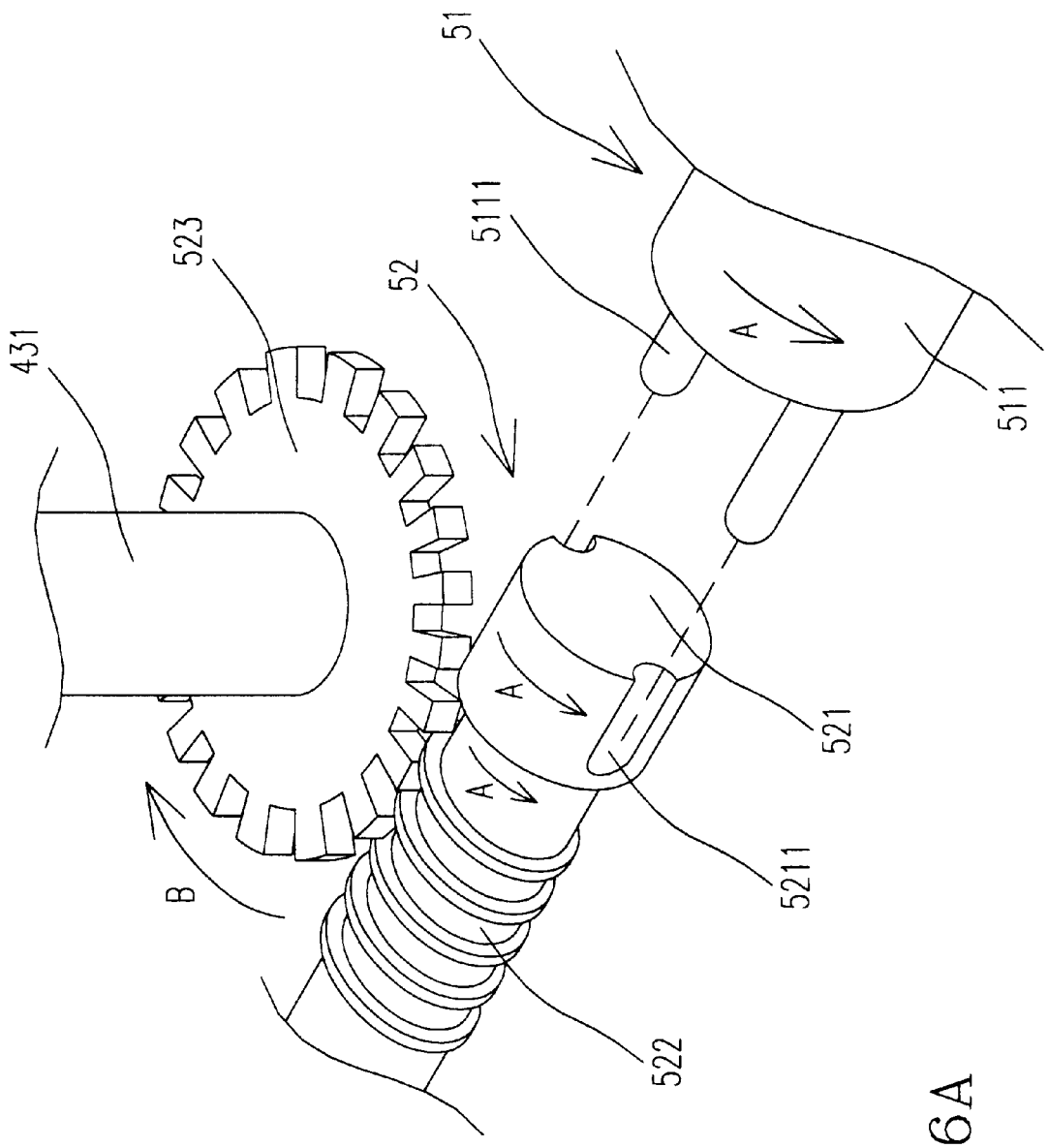
FIG. 6A schematically shows the engagement relationship among the coupling members of a clutch device according to the present invention.

Please refer to FIG. 6A which schematically shows the engagement relationship between the film-expanding device and the clutch device according to the present invention. As described above, a part 51 of the clutch device 5 is located beside the movable working platform group 1, 2 and 4, and another part 52 of the clutch device is mounted in the working platform group. When the film-expanding operation is to be performed, the working platform group 1, 2 and 4 is moved toward the clutch part 51 in order to engage the clutch part 52 with the clutch part 51. The clutch part 51 includes a motor 513 (FIG. 6B), and a plug connector 511 having two plugs 5111. The clutch part 52 includes a receptacle connector 521 having two depressions 5211, a worm 522, and a worm gear 523 penetrating therethrough one of the bolts 43 which serves as an active bolt 431 for the following operation. That the film-expanding device is engaged with the clutch device means that the plugs 5111 are received by the depressions 5211 so that the bolt 431 can be rotated through the elements 523, 522, 521 and 511 driven by the motor 513.

In detail, the plug connector 511 transmits the receptacle connector 521 and the worm 523 to rotate in a first direction indicated by an arrow A, and as known to those skilled in the art, the worm gear 523 transmitted by the worm 522 is turned into a second direction orthogonal to the first direction (arrow B). Accordingly, the bolt 431 will rotate in the second direction B. The rotation of the bolt 431 transmits the corresponding belt pulley 41 therearound to rotate. Meanwhile, all the belt pulleys 41 are simultaneously rotated though the belt 42. Accordingly, all the bolts 43 simultaneously rotate to raise or lower the plywood 44.

It is to be emphasized that according to the present invention, as shown in FIG. 6A, the input torque from the plug connector 511 of the clutch device is orthogonal to the resulting rotational torque of the bolt 431 of the film-expanding device. Therefore, the input torque will not render the rotating seat 21 to shake. In other words, the film-expanding operation will be stable and smooth.

Figure 6B:
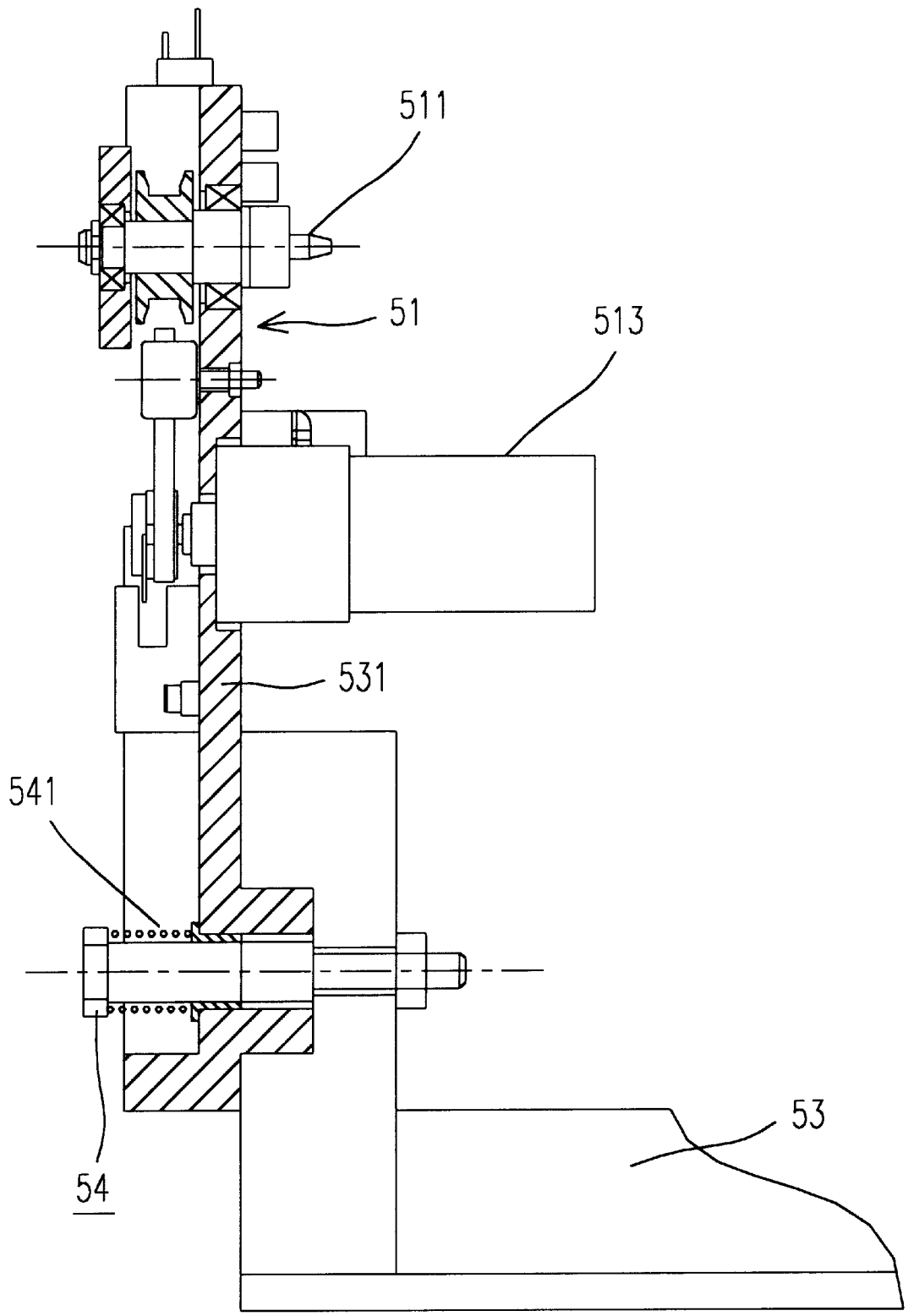
FIG. 6B is a side elevational view of a part of the clutch device 5 according to the present invention.

Moreover, further referring to FIG. 6B, the clutch part 51 preferably further includes a buffering member 54. All the elements included in the clutch part 51 is supported by a stand 53. A wall 531 of the stand 53 is movable owing to the buffering member 54 therebehind. The buffering member 54 includes a spring 541. When the clutch part 52 moves toward the clutch part 51, the two plugs 5111 are supposed to be aligned with the depressions 5211. If the two plugs 5111 are not aligned with the depressions 5211, the stand wall 531 will be pressed to slightly move backward against the spring 541 so as to avoid the plugs 5111 to be damaged.

CHIP-PICKING DEVICE

Figure 7:
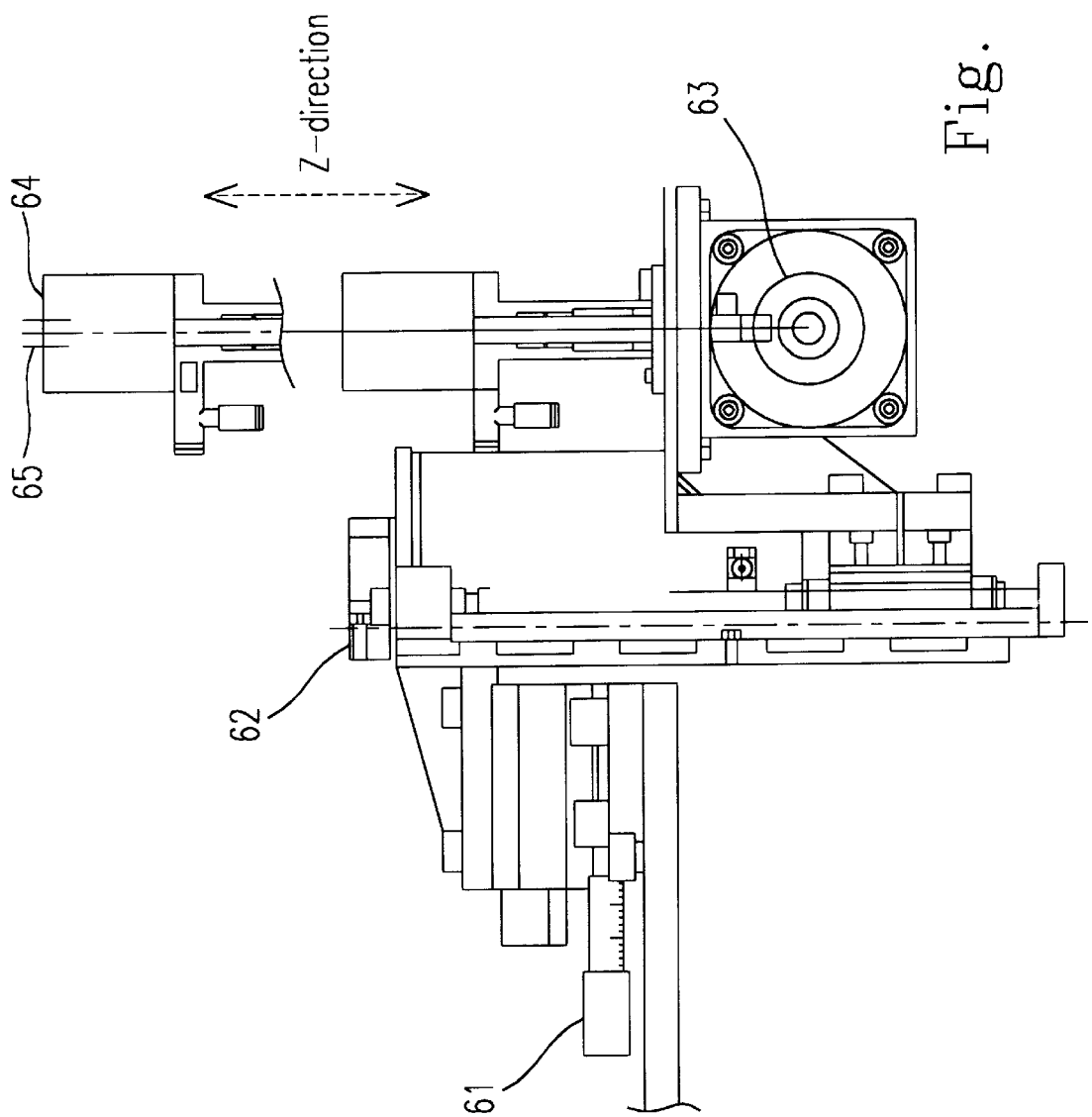
FIG. 7 is an elevational side view schematically showing a preferred embodiment of a chip-picking device according to the present invention.

Please refer to FIG. 7 which is an elevational side view schematically showing a preferred embodiment of a part of a chip-picking device according to the present invention. As mentioned in SHIFTING DEVICE, the working platform group is moved by the shifting device to a chip-picking position after the film expansion operation. The chip-picking position is above where the chip-picking device is located.

The chip-picking device includes an ejection driver 63, a suction member 64 and an ejecting pin 65. After the blue film loading the chips thereon is positioned properly, the suction member 64 is attached to the blue film under the control of a controller (not shown) for positioning a selected chip, and the controller has the ejection driver 63 drive the ejecting pin 65 to eject the selected chip. Then, a mechanical arm (not shown) can easily pick the ejected chip up. If there is an auxiliary optical device provided over the blue film to monitor the chip-picking operation, a better efficiency may be achieved.

On the other hand, the chip-picking device preferably further includes a fine tuner 61 and a level-adjusting device 62. The fine tuner 61 consisted of an X-tuner and a Y-tuner in order to finely adjust the position of the chip-picking device before the apparatus starts to operate. The level-adjusting device 62 is used for lowering the chip-picking device during the film-expanding device is moved between the film-expanding position and the chip-picking position in order to avoid interfering the movement of the film-expanding device.

To sum up, the present invention provides a chip supplying apparatus having novel film-expanding and clutch devices, and specifically designed shifting and rotating devices to solve the problems of operational unstableness, improperly large area, and loading/unloading hindrance of wafer.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A chip supplying apparatus for picking chips from a wafer positioned on an elastic film, said apparatus, comprising:
    a working platform for supporting said elastic film thereon;
    a film-expanding device located on said working platform, positioning said elastic film therein by holding a side portion of said elastic film, and performing a film-expanding operation by changing a level of a central portion of said elastic film relative to said side portion in response to an input torque to stretch said elastic film in order to increase clearances between every two chips before a chip-picking operation is to be performed;
    a clutch device optionally engaged with said film-expanding device for keeping said film-expanding device from moving, and providing said input torque for said film-expanding device when said film-expanding operation of said elastic film is to be performed;
    a shifting device movably engaged with said working platform for optionally moving said working platform so as to allow said film-expanding device with said elastic film located on said working platform to be moved between a film-expanding position and a chip-picking position; and
    a chip-picking device located at said chip-picking position for picking a selected chip from said elastic film which is held by said film-expanding device and moved to said chip-picking position by said shifting device;
    wherein said input torque provided by said clutch device is orthogonal to the resulting rotation torque of said film-expanding device.

2. The chip supplying apparatus according to claim 1 further comprising a rotating device for optionally rotating said elastic film in order to move said selected chip to said chip-picking position relatively efficiently, said rotating device including:
    a first motor;
    a rotating seat located on and rotatable relative to said working platform, and positioned thereon said film-expanding device with said elastic film;
    a first gear securely mounted around said rotating seat; and
    a second gear engaged with said first gear and driven by said first motor to rotate said rotating seat so as to rotate said elastic film to move said selected chip.

3. The chip supplying apparatus according to claim 2 wherein said rotating device further includes a bearing mounted between said rotating seat and said working platform for facilitating the rotation of said rotating seat.

4. The chip supplying apparatus according to claim 2 wherein said film-expanding device includes:
    a plywood having a plurality of threaded holes and used for clamping said elastic film in position;
    a plurality of belt pulleys mounted on said rotating seat, each of which has a through hole respectively aligned with one of said threaded holes;
    a belt connecting said plurality of belt pulleys for simultaneously transmitting said plurality of belt pulleys to rotate;
    a plurality of bolts, each of which is respectively engaged with one of said threaded holes and secured in one of said through holes, one of said plurality of bolts serving as an active bolt and being driven by said clutch device to rotate said belt pulleys for allowing said plywood to move upwards/downward; and
    a film-expanding ring located below said elastic film, and stretching said elastic film when said plywood moves downward.

5. The chip supplying apparatus according to claim 4 wherein said rotating seat has a plurality of through holes respectively aligned with said threaded holes of said plywood and said through holes of said belt pulleys so that each of said bolts passes through one threaded hole and two through holes and protrudes downward from said rotating seat.

6. The chip supplying apparatus according to claim 5 wherein said clutch device includes:
    a stand;
    a second motor mounted on a stand wall of said stand;
    a first coupling member mounted on said stand wall and driven by said second motor to rotate in a first direction;
    a second coupling member located below said rotating seat, and engaged with said first coupling member to be rotated in said first direction when said film-expanding operation is to be operated; and
    a third coupling member located below said rotating seat, engaged with said second coupling member and said active bolt, and rotating said active bolt in a second direction orthogonal to said first direction in response to the rotation of said second coupling member in said first direction for performing said film-expanding operation.

7. The chip supplying apparatus according to claim 6 wherein said first coupling member is a plug connector including two symmetric plugs, said second coupling member is a receptacle connector including two depressions for respectively receiving therein said two plugs, and said third coupling member includes a worm and a worm gear.

8. The chip supplying apparatus according to claim 7 wherein said clutch device further includes a buffering member behind said stand wall to allow said stand wall slightly move back when said plugs cannot enter said depressions adequately in order to protect said plugs.

9. The chip supplying apparatus according to claim 8 wherein said buffering member includes a spring.

10. The chip supplying apparatus according to claim 1 wherein said shifting device includes:
- an X-directional guiding member consisting of a sliding track and a servo-type motor for sliding said working platform along an X-direction; and
- a Y-directional guiding member consisting of a sliding track and a servo-type motor for sliding said working platform along a Y-direction perpendicular to said X-direction;
- wherein one of said X- and said Y-directional guiding means is located over the other one.

11. The chip supplying apparatus according to claim 1 wherein said chip-picking device includes:
- an ejection driver;
- an ejecting pin arranged under said chip-picking position of said film-expanding device and driven by said ejecting driver to eject upward said selected chip when said chip-picking operation is performed; and
- a suction member attached to said elastic film for positioning said selected chip when said chip-picking operation is performed so as to facilitate an ejection operation of said ejecting pin.

12. The chip supplying apparatus according to claim 11 wherein said chip-picking device further includes an adjusting device for lowering said chip-picking device during said film-expanding device is moved between said film-expanding position and said chip-picking position in order to avoid interfering the movement of said film-expanding device.

* * * * *